United States Patent [19]
Jackson et al.

[11] Patent Number: 5,592,165
[45] Date of Patent: Jan. 7, 1997

[54] METHOD AND APPARATUS FOR AN OVERSAMPLED DIGITAL TO ANALOG CONVERTOR

[75] Inventors: Harry S. Jackson; Michael A. Margules, both of Austin, Tex.

[73] Assignees: Sigmatel, Inc., Austin; Dallas Semiconductor Corporation, Dallas, both of Tex.

[21] Appl. No.: 515,309

[22] Filed: Aug. 15, 1995

[51] Int. Cl.$^6$ .................................................. H03M 3/02
[52] U.S. Cl. .......................... 341/143; 341/144; 341/145; 341/120
[58] Field of Search ..................................... 341/118, 119, 341/120, 143, 144, 195

[56] References Cited

U.S. PATENT DOCUMENTS

| | | | |
|---|---|---|---|
| 3,543,009 | 11/1970 | Voelcker, Jr. | 235/150.4 |
| 4,967,140 | 10/1990 | Groeneveld et al. | 323/315 |
| 5,323,157 | 6/1994 | Ledzius et al. | 341/143 |
| 5,331,583 | 7/1994 | Hara et al. | 364/724.01 |
| 5,442,354 | 8/1995 | Cabler | 341/143 |

OTHER PUBLICATIONS

"A CMOS Oversampling D/A Converter with a Current-Mode Semidigital Reconstruction Filter," Su, et al., *IEEE Journal of Solid-State Circuits, vol. 28, No. 12, Dec. 1993, pp. 1224–1233.*

Primary Examiner—Jeffrey A. Gaffin
Assistant Examiner—Jason H. Vick
Attorney, Agent, or Firm—Jenkens & Gilchrist

[57] ABSTRACT

A method and apparatus for an oversampled single bit digital to analog convertor (DAC) is accomplished by using an FIR filter as the analog reconstruction filter, wherein the FIR filter includes primary current sourcing circuitry and secondary current sourcing circuitry. The primary current sourcing circuitry is used to produce a portion of the FIR coefficients having relatively large values, while the secondary current sourcing circuitry is used to fine tune the FIR coefficients having the relatively large values and to produce the other FIR coefficients. Combining the results of the primary current sourcing circuitry and the secondary current sourcing circuitry produces an analog signal.

20 Claims, 4 Drawing Sheets

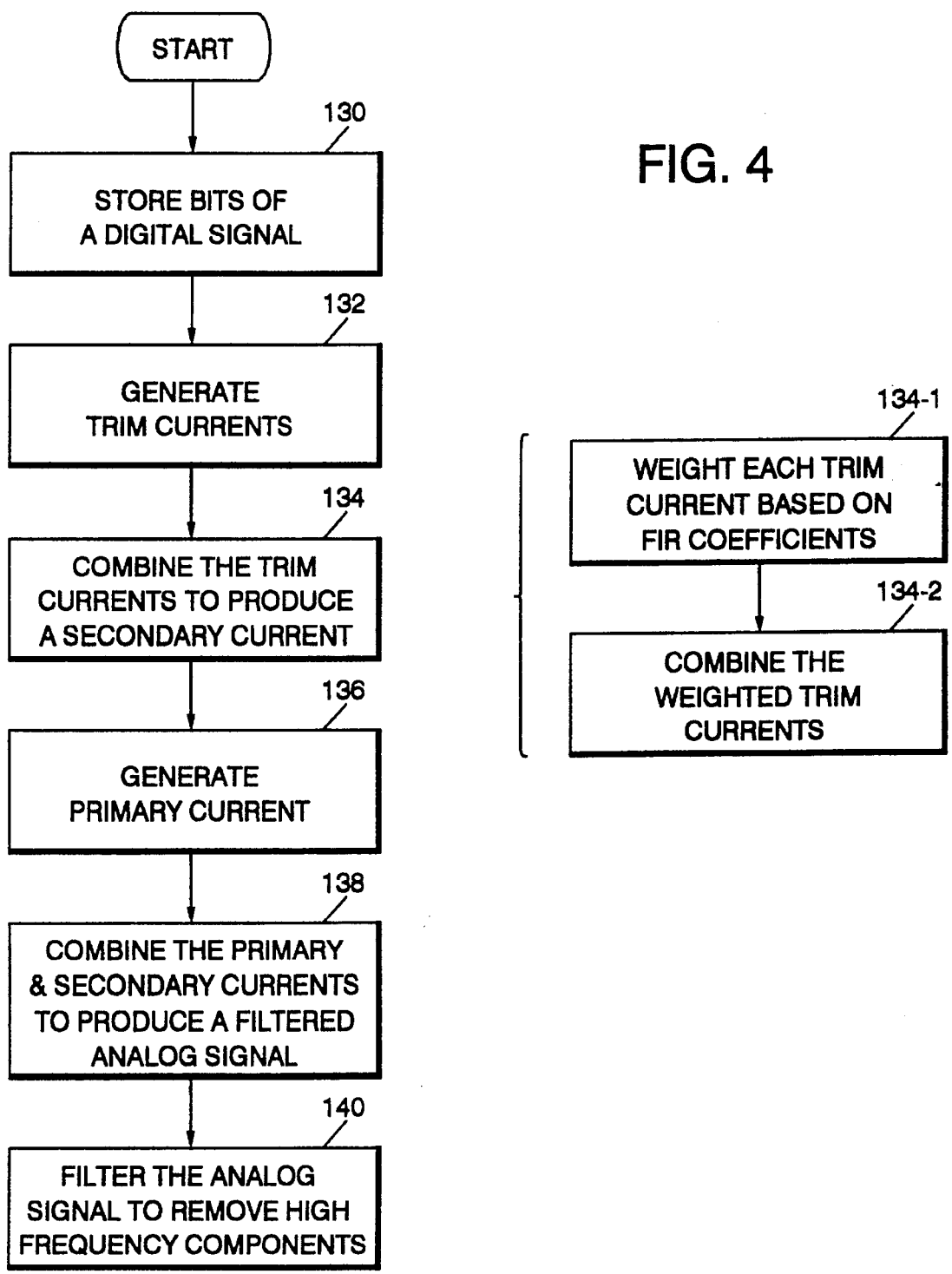

METHOD AND APPARATUS FOR AN OVERSAMPLED DIGITAL TO ANALOG CONVERTOR

TECHNICAL FIELD OF THE INVENTION

This invention relates generally to digital to analog convertors and, more particularly, to an oversampled digital to analog convertor.

BACKGROUND OF THE INVENTION

Digital to analog convertors (DAC) are known to be used in almost every type of audio and/or visual equipment to convert processed digital signals into analog signals which may then be render audible, if the analog signals are audio signals, or render visible if the analog signals are video signals. The audio/visual equipment produces the processed digital signals by receiving an input analog signal (representative of audio signals or video signals) and converts such analog signals into digital signals. In the digital domain, the audio/visual equipment filters, mixes, compresses/decompresses, encrypts/decrypts, and/or modulates/demodulates the digital signals to produce the processed digital signals.

One commonly used DAC is a Sigma-Delta DAC. A Sigma-Delta DAC includes an interpolation filter, a digital noise shaper (Sigma-Delta modulator) and an analog reconstruction filter. The interpolation filter receives a multi-bit digital word having a first sampling frequency and converts the digital word into a multi-bit word having a second sampling frequency, where the second sampling frequency is greater than the first. Such frequency adjustments are referred to as interpolation.

The multi-bit words having the second sampling frequency are then converted into single bit words having the second sampling frequency by the digital noise shaper. This conversion uses single bit quantization, but introduces quantization noise. Most of the energy of the quantization noise is above the audio frequency range.

Typical analog reconstruction filters may be a low pass filter constructed using switch-capacitor techniques and/or resistor-capacitor (RC) circuits. While switch-capacitor low pass filters may readily be implemented on CMOS integrated circuits, they have a non-linear phase response and signal dependent charge response which causes distortion which restricts their applicability. The RC circuits provide a wide dynamic ranges, but require precise component matching to achieve the desired results.

U.S. Pat. No. 5,323,157, issued to Ledzius et al, discloses a Sigma-Delta digital-to-analog converter that includes an analog reconstruction circuit that avoids the problems mentioned above. In the Ledzius patent, the sigma delta DAC includes the interpolation filter, the sigma delta modulator, and a finite impulse response (FIR) filter which functions as the analog reconstruction circuit. As is known, an FIR filter may be configured, by scaling FIR coefficients, to provide low pass filtering of digital signals and provide a coarse analog output. The coarse analog output may be further filtered by a single pole low pass filter.

In the Ledzius patent, the FIR coefficients are provided by tuned current sources coupled to a summing node. A current source provides a current to the summing node when an associated digital bit is a logic "1" and does not provide a current when the associated digital bit is a logic "0". While this implementation overcomes the drawbacks of the RC circuits and the switched capacitor circuits, it requires the current sources to be matched, which is difficult using CMOS technology. As is known, FIR coefficients have a wide range of values which results in a large disparity between the smallest coefficient and the largest coefficient. Due to this large disparity, it is very difficult to match the current sources using CMOS technology. If the current sources are not matched, the FIR filters performance is diminished, especially in stop band attenuation. To improve the FIR filters performance, additional taps, or FIR coefficients are needed, thereby increasing the size and complexity of the FIR filter.

Therefore, a need exists for a method and apparatus that implements a digital to analog convertor that uses oversampling techniques but does not have the limitations of the prior art described above.

BRIEF DESCRIPTION OF THE DRAWINGS

FIG. 4 illustrates a logic diagram that may be used to implement a D-A convertor in accordance with the present invention.

DETAILED DESCRIPTION OF THE DRAWINGS

Generally, the present invention provides a method and apparatus for an oversampled single bit digital to analog convertor (DAC). This is accomplished by using an FIR filter as the analog reconstruction filter, wherein the FIR filter includes primary current sourcing means and secondary current sourcing means. The primary current sourcing means is used to produce a portion of the FIR coefficients having relatively large values, while the secondary current sourcing means is used to fine tune the FIR coefficients having the relatively large values and to produce the other FIR coefficients. Combining the results of the primary current sourcing means and the secondary current sourcing means produces an analog signal. With such a method and apparatus, an oversampled, or sigma delta, D-A convertor achieves higher or equivalent stop band attenuation as the disclosed prior art DACS using fewer taps, thereby reducing size and complexity.

Figure 1:
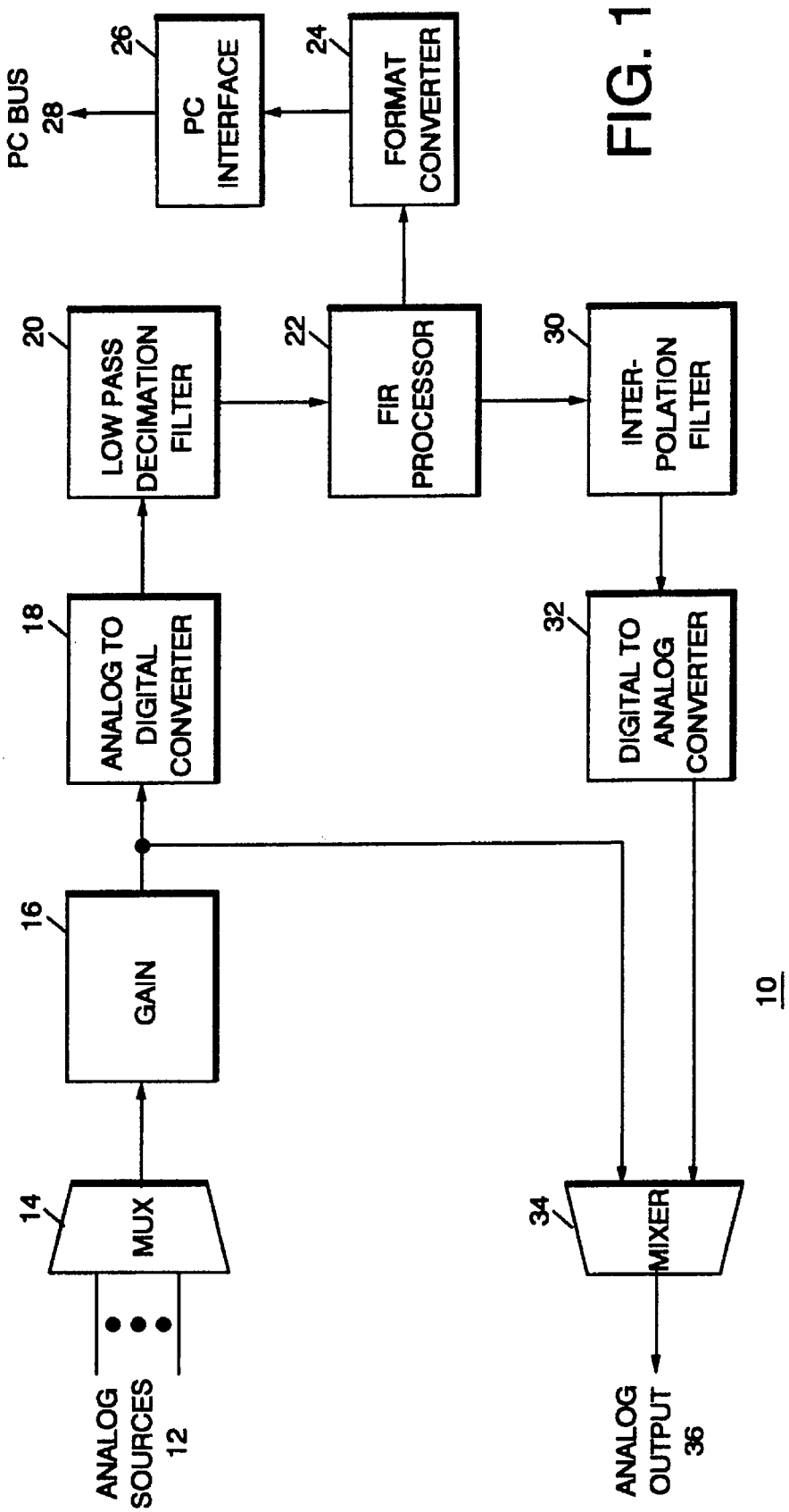
FIG. 1 illustrates an audio processing system that includes a digital to analog convertor in accordance with the present invention.

FIG. 1 illustrates a sound system coder/decoder (CODEC) 10 that includes a multiplexor 14, a gain stage 16, an analog to digital converter (ADC) 18, a low pass decimation filter 20, an FIR processor 22, a format converter 24, a PC interface 26 coupled to a PC bus 28, an interpolation filter 30, a digital to analog converter (DAC) 32, and a mixer 34. In operation, the multiplexor 14 receives a plurality analog signal from analog sources 12 and supplies a selected one of the analog signals to the gain stage 16. The gain stage 16 amplifies the audio signal which is converted into a digitized analog signal via the ADC 18. The gain stage 16 also supplies the amplified analog signal to the mixer 34 such that the incoming analog signal can be mixed with processed, or stored, signals. Note that the analog signal may be an audio signal, a video signal, or a subaudible signal. If the analog signal is an audio signal it may be sourced by a CD-ROM, a DAT driver, an FM or wave table synthesizer, or any type of digital audio source.

The ADC 18, which may be a sigma-delta converter, provides the digitized analog signal, as a single bit high sampling rate signal, to the low pass decimation filter 30. The low pass decimation filter 30, which may be a comb filter or cascaded integrated comb filter, steps down the sampling rate, reduces high frequency quantization noise introduced by the ADC 18, and converts the digitized signal into a multi-bit digital signal. For example, the ADC 18 may output a single bit digital single having a sampling rate 9 MHz +/−20% which the low pass decimation filter 30 converts to a 16 bit 500 KHz +/−20% digital signal. The decimated digital signals are routed to the FIR processor 22.

As shown, the FIR processor 22 provides processed digital signals to the interpolation filter 30 and transceives digital signals with the format converter 24. Digital signals provided to the interpolation filter 30 will be multi-bit mid range sampling rate digital signals. For example, such digital signals may be 16 bit 350 KHz +/−20% digital signals. Digital signals transceived with the format converter 24 will be multi-bit low sampling rate signals. For example, such digital signals may be 16 bit 3 KHz to 64 KHz signals.

The format convertor 24 is coupled to the PC interface 26 which couples to the PC bus 28. With such a configuration, the sound system CODEC 10, when incorporated in a personal computer (PC), enables the PC to perform multi-media and other audio programs at CD quality levels. With the bi-directional PC interface 26, the PC can provide digitized analog signals to the sound system CODEC 10 for processing, and/or the PC can receive processed signal from the sound system CODEC 10. The digitized analog signals may be digitized using either A-law, mu-law or adaptive differential pulse code modulation (ADPCM) techniques which are converted in the format converter 24. These techniques and such conversions are well known in the art; thus, no further discussion will be presented except to illustrate the present invention further.

As mentioned, the FIR processor 22 also provides processed digital signals to the interpolation filter 30. The interpolation filter 30, which may be a comb filter or cascaded integrated comb filter, increases the sampling rate of the processed digital signals, reduces the signal to a single bit, and filters images created by the interpolation process. For example, the interpolation filter 30 may receive a 16 bit 350 KHz signal and converts it into a single bit, 6 MHz digital signal.

The interpolated signal is then converted to an analog signal via the DAC 32. The analog signal is routed to the mixer 34 and subsequently rendered audible if the analog signal is an audio signal. Note that the sound system CODEC 10 may be implemented discretely, as a separate integrated circuit, or as part of an integrated circuit.

Figure 2:
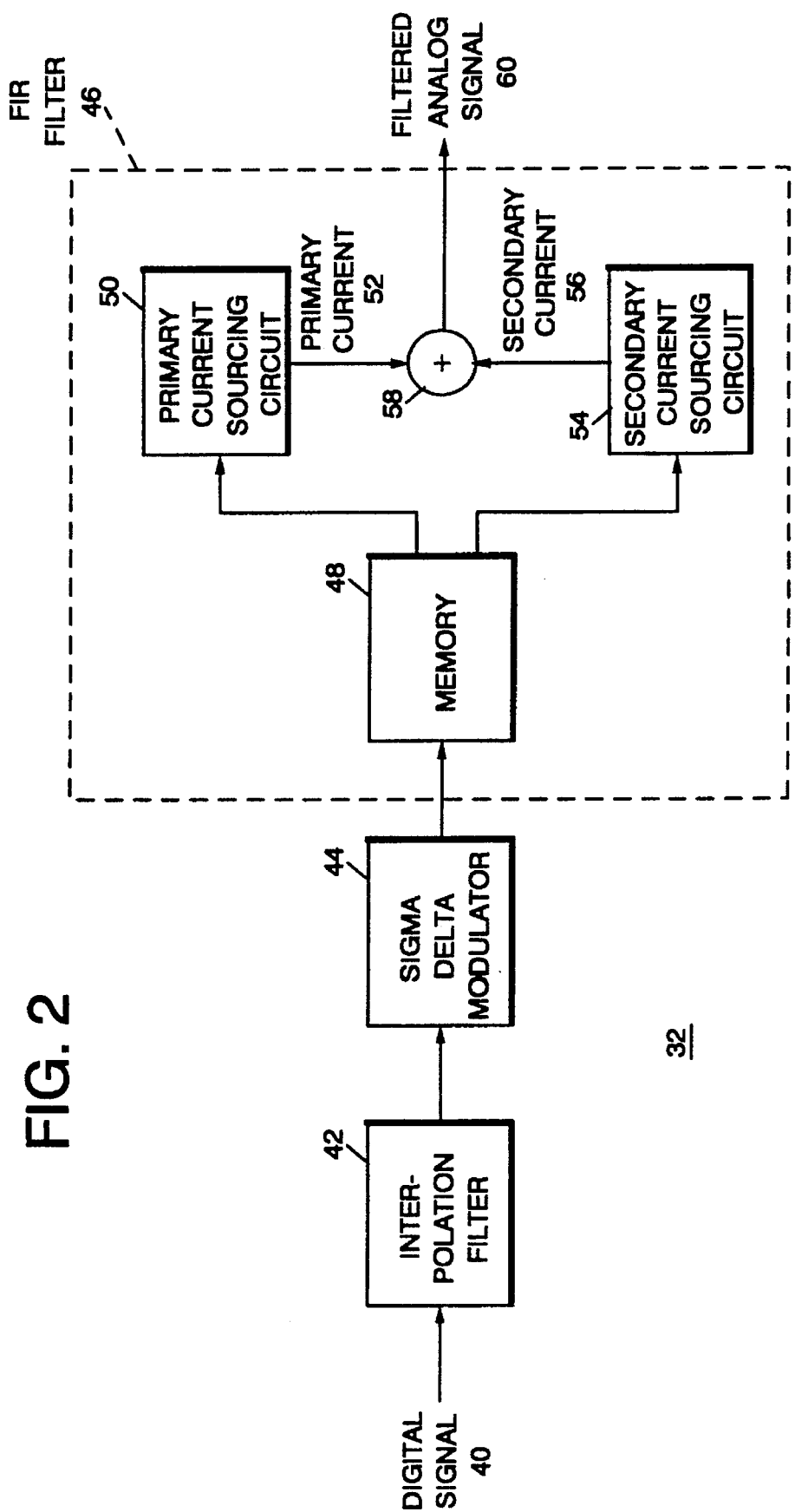
FIG. 2 illustrates a sigma delta D-A convertor in accordance with the present invention.

FIG. 2 illustrates the digital to analog convertor 32 which receives digital signals 40 via an interpolation filter 42. The interpolation filter 42 performs linear interpolation of the digital signals 40 and filters out high frequency images which are created in the interpolation process of the interpolation filter 30. Oversampled digital signals produced by the interpolation filter 42 are routed to a sigma delta modulator 44 which performs a noise shaping function. The noise shaping function shapes the quantization noise produced by the interpolation process and produces a single bit word having a high sampling rate. The resulting single bit word is stored in memory 48 of the FIR filter 46.

As shown, the FIR filter 46 includes the memory 48, a primary current sourcing circuit 50, an adder 58, and a secondary current sourcing circuit 54. The primary current sourcing circuit 50 and the secondary current sourcing circuit 54, together, produce the FIR coefficients for the FIR filter. Depending on the values of the single bit words stored in the memory 48, the primary and secondary current sourcing circuits 50, 54 produce a primary current 52 and a secondary current 56. The primary current 52 represents a coarse product of relatively large FIR coefficients multiplied by corresponding single bit words, while the secondary current 56 represents a fine product of the relatively large FIR coefficients multiplied by the corresponding single bit words and the other FIR coefficients multiplied by their corresponding single bit words. The primary and secondary currents 52, 56 are summed by the adder, or summing node, 58 to produce a filtered analog signal 60.

Figure 3:
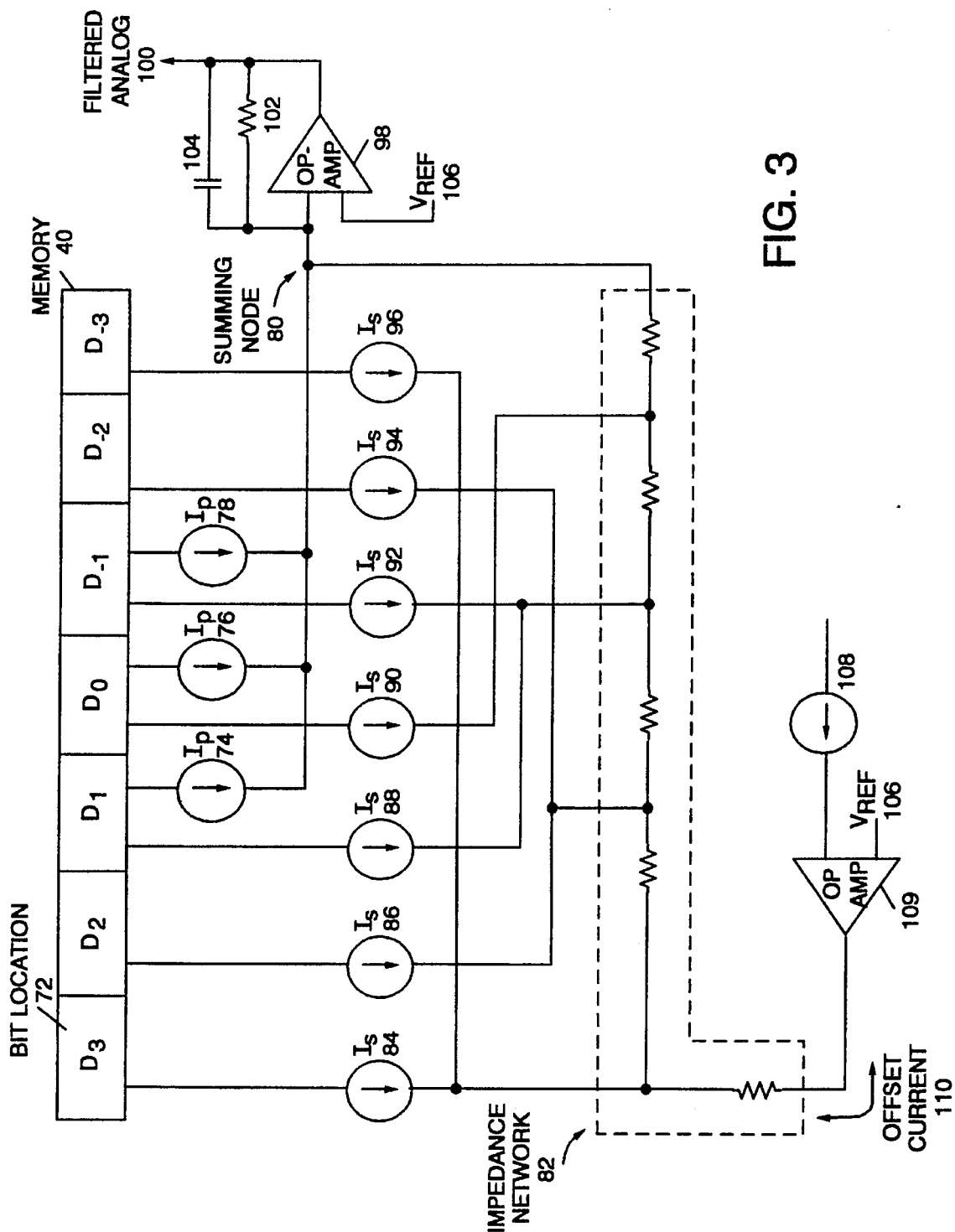
FIG. 3 illustrates a finite impulse response filter in accordance with the present invention.

FIG. 3 illustrates an exemplary 7-tap FIR filter 46 that includes memory 48, a plurality of primary current sources 74–78, a summing node 80, a plurality of secondary current sources 84–96, an impedance network 82, a first operational amplifier 98, and a second operational amplifier 109. The memory 48 stores single bits words D0 through D+/−3 which represent sampled data of a digital bit stream in bit locations 72. The digital bit stream is representative of the digital signal 40 of FIG. 2 and may be a digitized analog signal such as a digitized audio signal or a digitized video signal.

The primary current sources 74–78 are coupled at one end to a bit location of the memory and, at the other end, to a summing node 80. Each of the primary current sources 74–78 has substantially equal current supplying capabilities, will supply a first current when the data stored in the corresponding bit location is in a first state, and will supply a second current when the data in the corresponding bit location is in a second state. For example, if the D0, D+1, and D−1 bit locations are each storing a logic "1", then each primary current source 74–78 will supply a first current in the range of 10 nA to 10 mA. If, however, the D0, D+1, and D−1 bit locations are storing a logic "0", then each primary current source 74–78 will supply a second current in the range of 0.00 to 1/10 of first current. The actual current value will dependent on circuit requirements.

The plurality of secondary current sources 84–96 are each coupled at one end to a bit location of the memory 40 and, at the other end, to a tap in the impedance network 82. The secondary current sources 84–96 will each supply a first current to the impedance network 82 when the data stored in the corresponding bit location is in a first state and will each supply a second current to the impedance network 82 when the data in the corresponding bit location is in a second state. For example, if all of the bit locations are storing a logic "1" then each secondary current source 84–96 will supply a first current in the range of 1/100 to 1/2 of the current supplied by a primary current source. If, however, all the bit locations are storing a logic "0", then each secondary current source 84–96 will supply a second current in the range of 0.00 to 1/10 of first current.

Currents supplied to the impedance network 82 by the secondary current sources 84–96 will be scaled and provided to the summing node 80. The impedance network 82, which may be a resistive network, provides a linear current division of the received currents. This is accomplished by coupling one end of the impedance network 82 to the operational amplifier 109 and the other end to the summing node 80. Values of the impedance elements in the impedance network 82 are chosen to provide a current division of the secondary current sources which allows an accurate portion of each secondary current to flow to the summing node and the excess current to flow to the secondary amplifier as an offset current 110. The offset current 110 is established by the operational amplifier 109 which has a current source 108 and a voltage reference 106 as its inputs.

As mentioned, the summing node 80 receives currents from the primary current sources 74–78 and a current from the impedance network 82. These currents are combined to produce a filtered analog representation, in current form, of the digital bit stream stored in the memory 40. By combining the currents in this manner, an accurate FIR process can be obtained using fewer taps than current source FIR filters of the prior art. In particular, the two sets of current sources—primary and secondary—each include current sources that have the same current sourcing capabilities. With similar current supplying capabilities, matching of the current sources within a set is better than the prior art trimmed current sources because the currents are of equal and reasonably large values. Filtering characteristics of the FIR filter 46 are also improved over the prior art because the FIR coefficients can be set by a resistive divider, which in a CMOS process, provides better matching than current sources.

The above discussion with reference to FIG. 3 has primarily focussed on a general operational description. To further illustrate the present invention, the following will focus on an exemplary discussion of the FIR filter 46. First assume that, for the data stored in memory 40, the FIR filter 46 will perform one FIR process which can be mathematically defined as:

$$I0=D0*C0+D1*C1+D-1*C-1+D2*C2+D-2*C-2+D3*C3+D-3*C-3.$$

In this equation I0 represents a filtered analog version of the digital information stored in the memory 40.

Each of the products (Di*Ci) are produced by a combination of the primary current sources 74–78, if one is present, the secondary current sources 84–96, and the impedance network 82. For example, the product of D0*C0 is produced by the combination of the primary current source 76, the secondary current source 90, and the impedance network. In this example, D0 will either be a logic "1" or a logic "0", thus, the currents supplied by the primary current source 76 and the secondary current source 90 are representative of the FIR coefficient C0. To produce an accurate FIR coefficient C0, the primary current source 76 supplies a coarse, or primary, current which is summed with a tuned portion of the current supplied by the secondary current source 90. The current supplied by the secondary current source 90 is tuned, or trimed, via the impedance network and the offset current 110 such that the FIR coefficient is accurately represented. One skilled in the art will readily appreciate how to select the desired current levels of the primary and secondary current sources as well as the values in the impedance network to produce an FIR filter in accordance with the present invention.

The remaining products in the equation are produced in a similar manner. The products are then summed by the summing node 80 to yield a current signal representative of a filtered analog signal of the data stored in the memory 40. The current signal may be converted to a voltage signal via the operational amplifier 98 and resistor 102. This current to voltage conversion produces a filtered analog signal 100 which may be further enhanced by low pass filter 104.

As one skilled in the art will readily appreciate a secondary current source may be omitted if the primary current source can provide an accurate representation of the corresponding FIR coefficient. Similarly, when the FIR coefficient is relatively small, a primary current source may be omitted such that the secondary current source and the impedance network provide the FIR coefficient.

FIG. 4 illustrates a logic diagram that may be used by a digital signal processor, microprocessor, or microcontroller to implement the one-bit D-A convertor in accordance with the present invention. At step 130, bits of a digital signal are stored in memory. Having stored the bits, trim currents are generated at step 132 for each of the stored bits. The trim currents are then subsequently combined at step 134 to produce a secondary current. The combination of the trim currents is done by weighting each of the trim currents at step 134-1 based on the FRI coefficients. Having weighted the trim currents, the weighted trim currents are combined at step 134-2.

After generating the secondary current, or in congruency with, the process proceeds to step 136 wherein a primary current is generated based on the bits stored in the memory and desired FIR coefficients. Having generated the primary and secondary currents, they are combined at step 138 to produce a filtered analog signal. To further filter the analog signal, the process proceeds to step 140 to perform a low pass filter such that high frequency components of the signal are removed.

The present invention provides a single bit digital to analog convertor that includes a dual set current sourced FIR filter to provide analog reconstruction. The dual set current sourced FIR filter includes a plurality of primary current sources which supply a coarse current and a plurality of secondary current sources that supply, via an impedance network, a tuned current. Combining the coarse and tuned currents produces the analog signal. By using the dual set of current sources and the impedance network, the FIR filter yields high performance filtering with better filtering characteristics than were required in prior art FIR filters. This results because each current source in a set supplies the same current, thus making the current sources easier to match. Additionally, the elements of the impedance network are easier to match, thus, the FIR coefficients can be more accurately represented which provides better filtering characteristics.

We claim:

1. An oversampled digital to analog converter (DAC) comprising:

memory having at least N-bit locations, the memory receives and stores a digital bit stream;

primary current sources, each of the primary current sources having substantially equal current sourcing capabilities and each of the primary current sources being operably coupled, at one end, to a different one of the N-bit locations and operably coupled, at another end, to a summing node;

secondary current sources, each of the secondary current sources having substantially equal current sourcing capabilities, each of the secondary current sources are operably coupled, at one end, to a corresponding one of the N-bit locations and operably coupled, at another end, to a resistive network; and amplifier having a first input coupled to a reference and a second input coupled to the summing node and the resistive network, an output of the amplifier provides a filtered analog representation of the digital bit stream.

2. The DAC of claim 1 further comprises a second amplifier operably coupled to the resistive network, the second amplifier providing an offset current to the summing node via the resistive network.

3. The DAC of claim 2, wherein the secondary current sources includes N number of current sources operably coupled to taps in the resistive network to provide trimming currents to the summing node such that FIR coefficients are trimmed to desired values.

4. The DAC of claim 1, wherein the amplifier includes a feedback resistor and a capacitor operably coupled between the second input and the output of the amplifier.

5. The DAC of claim 1, wherein the primary current sources include M number of current sources, where M is less than or equal to N.

6. An oversampled digital to analog converter (DAC) comprising:

memory having at least N bit locations, the memory receives and stores a digital data stream;

primary current sourcing means, operably coupled to the memory, for supplying, based on data values within at least one of the N bit locations, a primary current value that represents a course filtering response;

secondary current sourcing means, operably coupled to the memory, for supplying, based on data values within each of the N bit locations, a secondary current value that represents a trimmed filtering response; and summing means for summing the primary current value and the secondary current value to produce a filtered analog representation of the digital data stream.

7. The DAC of claim 6, wherein the secondary current sourcing means further comprises a plurality of current sources, each of the plurality of current sources is operably coupled to a corresponding bit location of the N bit locations, each of the plurality of current sources supplying a first current when data in the corresponding bit location is in a first state and supplying a second current when the data in the corresponding bit location is in a second state.

8. The DAC of claim 7, wherein the secondary current sourcing means further comprises an operational amplifier and an impedance network having N-taps, one end of the impedance network is coupled to the operational amplifier and another end of the impedance network is coupled to the summing means, each of the plurality of current sources is operably coupled to a corresponding one of the N-taps.

9. The DAC of claim 6, wherein the summing means further comprises an operational amplifier having a first input coupled to a reference and a second input operably coupled to received the primary current value and the secondary current value.

10. The DAC of claim 6, wherein the primary current sourcing means comprises a plurality of current sources operably coupled to the N-bit shift register and the summing means.

11. A sigma delta digital to analog converter comprising:
interpolation filter;

sigma delta modulator operably coupled to the interpolation filter;

finite impulse response filter that includes:
memory having at least N bit locations, the memory receives and stores a digital data stream from the sigma delta modulator;
primary current sourcing means, operably coupled to the memory, for supplying, based on data values within at least one of the N bit locations, a primary current value that represents a course filtering response;
secondary current sourcing means, operably coupled to the memory, for supplying, based on data values within each of the N bit locations, a secondary current value that represents a trimmed filtering response; and
summing means for summing the primary current value and the secondary current value to produce a filtered analog representation of the digital data stream.

12. A method for performing finite impulse response (FIR) filtering upon a digital data stream, the method comprises the steps of:

a) storing bits of the digital data stream to produce stored bits;

b) generating a plurality of trim currents, each of the plurality of trim currents being generated in response to each of the stored bits, trim current values being at a first level when a corresponding stored bit of the stored bits is in a first state and being at a second level when the corresponding stored bit is in a second state;

c) combining the plurality of trim currents to produce a secondary current;

d) generating a primary current based on state of at least one of the stored bits;

d) combining the primary current and the secondary current to produce a filtered analog response of the stored bits.

13. The method of claim 12, wherein step (c) further comprises the steps of:

weighting each of the plurality of trim currents based on FIR coefficients of each of the corresponding stored bits to produce a plurality of weighted trim currents; and combining the plurality of weighted trim currents to produce the secondary current.

14. The method of claim 13, wherein the step of weighting further comprises the steps of:

providing the plurality of trim currents to taps of a resistive network; and sourcing an offset current at an end of the resistive network.

15. The method of claim 12, wherein step (d) further comprises the steps of:

summing the primary current and the secondary current to produce a resulting current;

converting the resulting current to a voltage, wherein the voltage represents the filtered analog response of the stored bits.

16. The method of claim 15 further comprises filtering the voltage to substantially attenuate high frequency components of the voltage.

17. A sound system coder/decoder (CODEC) comprising:
analog-to-digital converter;

a low pass decimation filter operably coupled to the analog-to-digital converter, the low pass decimation filter decimates digital signals received from the analog-to-digital converter;

digital-to-analog converter that includes:
sigma delta modulator operably coupled to the interpolation filter;
finite impulse response filter that includes:
memory having at least N bit locations, the memory receives and stores a digital data stream from the sigma delta modulator;
primary current sourcing means, operably coupled to the memory, for supplying, based on data values within at least one of the N bit locations, a primary current value that represents a course filtering response;
secondary current sourcing means, operably coupled to the memory, for supplying, based on data values within each of the N bit locations, a secondary current value that represents a trimmed filtering response; and summing means for summing the primary current value and the secondary current value to produce a filtered analog representation of the digital data stream;

an interpolation filter operably coupled to the digital-to-analog converter, the interpolation filter interpolates the filtered analog representation of the digital data stream; and an FIR processor operably coupled to the first and second anti-aliasing filter blocks.

18. The sound system CODEC of claim 17 further comprises a format converter operably coupled to the FIR processor, the format converter converts digitized audio signals between A-law, mu-law, and adaptive pulse code modulation.

19. The sound system CODEC of claim 18 further comprises a personal computer interface operably coupled to the format converter such that a personal computer performs audio class audio processing.

20. The sound system CODEC of claim 17 further comprises being implemented on an integrated circuit.

* * * * *